(12) United States Patent
Sanson

(10) Patent No.: US 8,872,097 B2
(45) Date of Patent: Oct. 28, 2014

(54) LOW-FLUX AND LOW-NOISE DETECTION CIRCUIT HAVING A READOUT CIRCUIT WITH SHIELDED INTEGRATION NODE

(75) Inventor: Eric Sanson, Grenoble (FR)

(73) Assignee: Societe Francaise de Detecteurs Infrarouges—Sofradir, Chatenay Malabry (FR)

( * ) Notice: Subject to any disclaimer, the term of this patent is extended or adjusted under 35 U.S.C. 154(b) by 263 days.

(21) Appl. No.: 13/476,444

(22) Filed: May 21, 2012

(65) Prior Publication Data

US 2012/0292490 A1 Nov. 22, 2012

(30) Foreign Application Priority Data

May 20, 2011 (FR) ..................... 11 01571

(51) Int. Cl.
 - H01L 31/00 (2006.01)
 - H01L 27/146 (2006.01)
 - H01L 27/148 (2006.01)

(52) U.S. Cl.
CPC .... *H01L 27/14603* (2013.01); *H01L 27/14818* (2013.01); *H01L 27/14623* (2013.01); *H01L 27/14634* (2013.01); *H01L 27/14636* (2013.01); *H01L 27/14643* (2013.01); *H01L 2224/16* (2013.01)
USPC ...................... 250/214.1; 250/208.2; 348/294; 257/292

(58) Field of Classification Search
CPC .................. H01L 27/14623; H01L 27/14818; H01L 27/14625; H01L 27/3272; H01L 29/78633
USPC ........ 250/214.1, 214 R, 208.2; 348/308, 294; 257/292, 506
See application file for complete search history.

(56) References Cited

U.S. PATENT DOCUMENTS

| | | | |
|---|---|---|---|
| 2004/0223065 A1* | 11/2004 | Takayanagi | 348/295 |
| 2008/0054162 A1* | 3/2008 | Fukuda et al. | 250/214 A |
| 2008/0210846 A1 | 9/2008 | Andrews et al. | |
| 2010/0060764 A1 | 3/2010 | McCarten et al. | |
| 2010/0230729 A1 | 9/2010 | Ellis-Monaghan et al. | |

FOREIGN PATENT DOCUMENTS

| | | |
|---|---|---|
| EP | 0 917 205 A2 | 5/1999 |
| JP | A-07-58308 | 3/1995 |

OTHER PUBLICATIONS

Aw et al., "A 128x128-pixel standard-CMOS image sensor with electronic shutter," *IEEE International Solid State Circuits Conference*, vol. 39, 1996, pp. 180-181 and 440.

* cited by examiner

*Primary Examiner* — Francis M Legasse, Jr.
(74) *Attorney, Agent, or Firm* — Oliff PLC

(57) ABSTRACT

The detection circuit of the Source Follower per Detector type comprises a photodiode connected to an integration node. A biasing circuit makes it possible to bias the photodiode between a first reverse-bias state and a second floating state. A readout circuit is connected to the integration node for generating a signal representative of the scene observed by the photodiode. A metal shielding is arranged around the integration node. The metal shielding is connected to an output of the readout circuit configured to have a potential varying in the same direction as the potential at the integration node.

11 Claims, 3 Drawing Sheets

LOW-FLUX AND LOW-NOISE DETECTION CIRCUIT HAVING A READOUT CIRCUIT WITH SHIELDED INTEGRATION NODE

TECHNICAL FIELD OF THE INVENTION

The invention relates to a Source Follower per Detector detection circuit.

STATE OF THE ART

In order to obtain very sensitive sensors, a detection circuit is made in a particular way by means of an architecture of the SFD type (Source Follower per Detector). This type of sensor works under conditions of low radiation, i.e. with a low incidental flux.

Like in conventional detectors, an incidental radiation is converted into an amount of electrons which is representative of the scene observed. For this type of sensor, it is important to limit the electronic noise generated by the detection circuit, i.e. the amount of electrons which is not related to the scene observed. A first way of reducing the amount of parasitic electrons is to limit the electric power consumption by the circuit, which leads to simplify the detection circuit. The integration of the charges emitted by the photodetector is then carried out by the internal capacitor of the photodetector.

As illustrated in FIG. 1, a detection circuit comprises a photodiode 1 with its internal capacitor 2. The circuit also comprises a biasing circuit 3 which makes it possible to cause the photodiode 1 to swing between a reverse-bias state and a floating state.

The photodiode 1 is also connected to a readout circuit 4 for processing the signal emitted by the photodiode 1.

The charges generated by the photodiode 1 are partly stored into the internal capacitor 2 of the photodiode 1, which results in a potential variation at the integration node N connected to the readout circuit 4. The electric capacitance of the integration node comes partly from the electric capacitance of the photodiode and partly from the parasitic capacitances of the other elements connected to the integration node N.

The improvement of the conversion gain of the detector also involves a reduction of the value of the electric capacitance at the integration node of the detection circuit, but the value of the parasitic capacitors generally has the same order of magnitude as that of the capacitor 2. Thus, there is always an important noise level as for electrons in low-flux detectors.

OBJECT OF THE INVENTION

It is noted that there is a need for a detection circuit which makes it possible to reduce the noise level during a low-flux use.

This need is satisfied by providing a circuit comprising:
a photodiode connected to an integration node,
a biasing circuit for biasing the photodiode between a first reverse-bias state and a second floating state,
a readout circuit connected to the integration node for generating a signal representative of the scene observed by the photodiode,
a metal shielding arranged around the integration node and connected to an output of the readout circuit, which output is configured to have a potential varying in the same direction as the potential at the integration node.

BRIEF DESCRIPTION OF THE DRAWINGS

Other advantages and features will more clearly arise from the following description of particular embodiments of the invention given as nonrestrictive examples and represented in the annexed drawings, in which.

DESCRIPTION OF PREFERENTIAL EMBODIMENTS OF THE INVENTION

Figure 1:
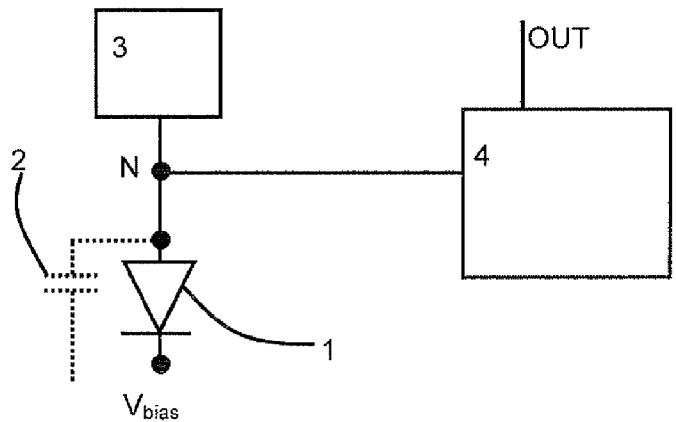
FIG. 1 is a schematic representation of a detection circuit of the SFD type.
Figure 2:
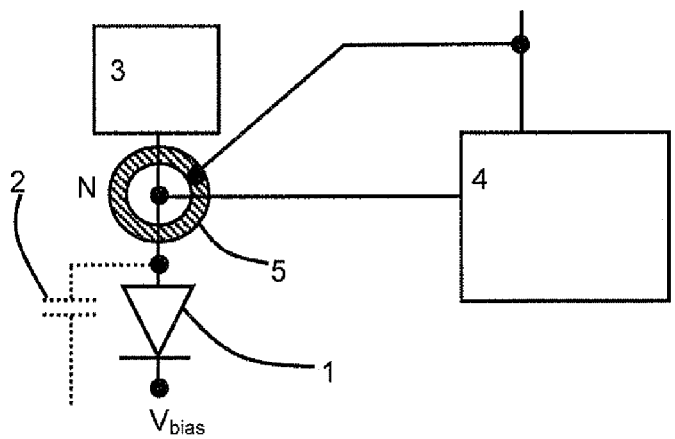
FIG. 2 is a schematic representation of another detection circuit of the SFD type provided with a shielding.

As illustrated in FIG. 2, the detection circuit of the SFD type (Source-Follower per Detector) comprises a photodetector 1 which is preferentially a photodiode. The photodetector 1 is associated with a biasing circuit 3. The biasing circuit 3 makes it possible to bias the photodetector 1 between first and second states. In the first state, the photodetector 1 is reverse biased. In a second state, the photodetector 1 is left in a floating state where it keeps its reverse bias while varying towards the forward bias according to the accumulation of the charges received.

In its floating state, the photodetector 1 transforms a light radiation into an electric charge which is stored into a capacitive retention node called integration node N. In this way, the information received by the photodetector 1 can be stored by the internal capacitance of the photodetector 1 materialized by the integration node N.

The circuit also comprises a readout circuit 4 which processes the information stored in the integration node N for generating a signal representative of the scene observed by the photodiode in order to send it to a processing circuit (not represented at the output of the readout circuit). As the readout circuit 4 and the biasing circuit 3 are not perfect, they introduce one or more electric capacitances into the detection circuit in addition to that of the internal capacitor of the photodetector 1. In the same way, the electric lines used for biasing or for transmitting charges into the circuit also introduce parasitic capacitances. All these parasitic capacitances modify the behavior of the circuit because the value of the electric capacitance associated with the integration node N is equal, not to the value of the internal capacitance 2 of the photodetector 1, but to the sum of the contributions of the various capacitances in the circuit. This capacitance association modifies the response of the circuit compared to its theoretical behavior. During acquisition phase, the photodetector is coupled to the retention node and to the readout circuit 4.

In order to reduce the influence of the parasitic capacitances during the reading of the information stored in the integration node N, the circuit comprises a shielding 5, preferentially made of metal, which is arranged around the integration node N. The shielding 5 physically surrounds the integration node N with one or more screens which are materialized by electrically conducting lines, for example made of metal. The shielding forms an electric-field screening or an electromagnetic shielding.

The shielding 5 is connected to an output of the readout circuit 4 which is configured to have a potential varying in the same direction as the potential of the integration node. The potential variation at the shielding 5 and at the integration node N in the same direction makes it possible to reduce the influence of the parasitic capacitances even preferentially to suppress the parasitic capacitances if the potential applied to the shielding follows the potential of the integration node. The charges at the terminals of the parasitic capacitances are then constant during the reading because they do no change under their biasing conditions.

Compared to a shielding associated with a fixed potential, the potential variation in the same direction at the shielding and at the integration node makes it possible to reduce the potential difference between the integration node and the shielding. That makes it possible to reduce the influence of the parasitic capacitances.

In a preferential embodiment, the output of the readout circuit 4 is configured to have a constant potential difference with the value of the integration node N. In this way, during the reading of the information stored in the integration node N, the potential variations at the integration node N are similar to the potential variations at the metal shielding 5. The potential difference between the integration node N and the metal shielding 5 is constant and follows the variations at the integration node N.

As the potential difference between the integration node N and the shielding 5 is constant, that makes it possible to virtually eliminate a part of the parasitic capacitances of the circuit. The capacitance value associated with the integration node N then comes close to the value of the capacitance of the photodetector 1.

Figure 3:
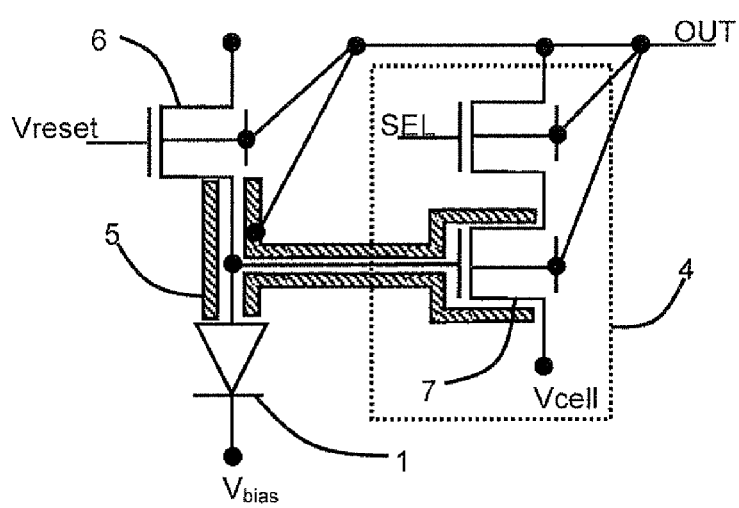
FIGS. 3 and 4 are schematic representations of two particular embodiments of a detection circuit of the SFD type provided with a shielding.

In a particular embodiment illustrated in FIG. 3, the shielding 5 is arranged at least partially around the line used for biasing the photodetector 1, i.e. around the line linking the biasing circuit 3 to the photodetector 1. In a more particular way, the shielding 5 is arranged around the line which connects the output of the last transistor 6 in the biasing circuit 3 to a first electrode of the photodetector 1. This embodiment makes it possible to strongly reduce the value of the parasitic capacitance associated with the biasing circuit 3.

In an alternative embodiment not represented, the shielding 5 is also placed around the last transistor of the biasing circuit 6 in order to reduce the influence of the parasitic capacitances.

In another embodiment which can be combined with the preceding embodiments, the shielding 5 is at least partially arranged around the line which links the input of the readout circuit 4 to the first electrode of the photodetector 1 as illustrated in FIG. 3.

In an alternative to the preceding embodiment, illustrated in FIG. 3, the shielding 5 is also arranged in the readout circuit 4 around one or more transistors enabling the transmission of the information contained in the integration node N (FIG. 3).

In a preferential embodiment, the first transistor of the readout circuit 4 receiving the information from the integration node N is completely surrounded by the shielding in order to strongly reduce the effect of the parasitic capacitances as illustrated in FIG. 3.

Figure 4:
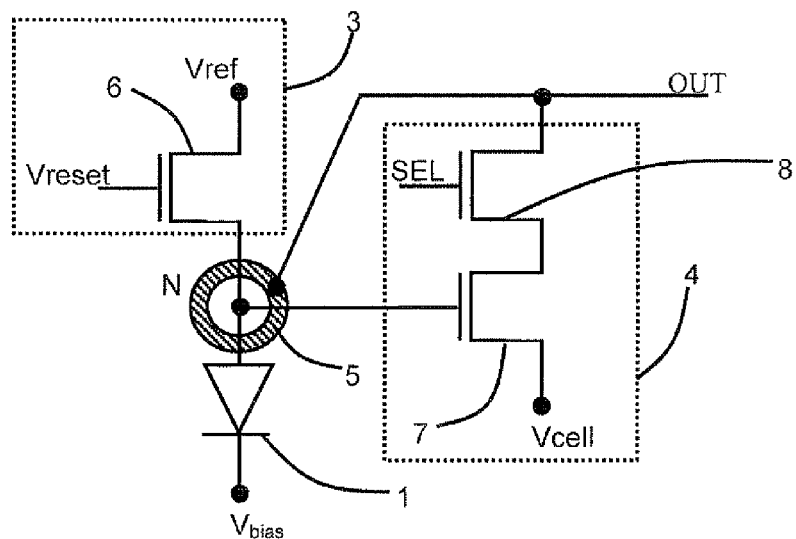

In a particular embodiment which is illustrated in FIGS. 3 and 4 and can be combined with the preceding embodiments, the readout circuit 4 comprises a follower transistor 7. The readout circuit 4 comprises a follower transistor 7 with an electrode connected to an electric node configured to have a potential which varies in the same direction as the potential at the integration node N. In a more particular embodiment, the follower transistor 7 includes a control electrode linked to the integration node N and another electrode linked to the output of the readout circuit 4 in a more or less direct way. Thus, the value of the potential at the integration node N, applied to the control electrode of the follower transistor 7, modifies the value of the signal delivered at the output of the transistor 7.

The follower transistor 7 is preferentially a field effect transistor with a gate electrode linked to the integration node and a source/drain electrode linked to the output of the readout circuit 4.

Figure 6:
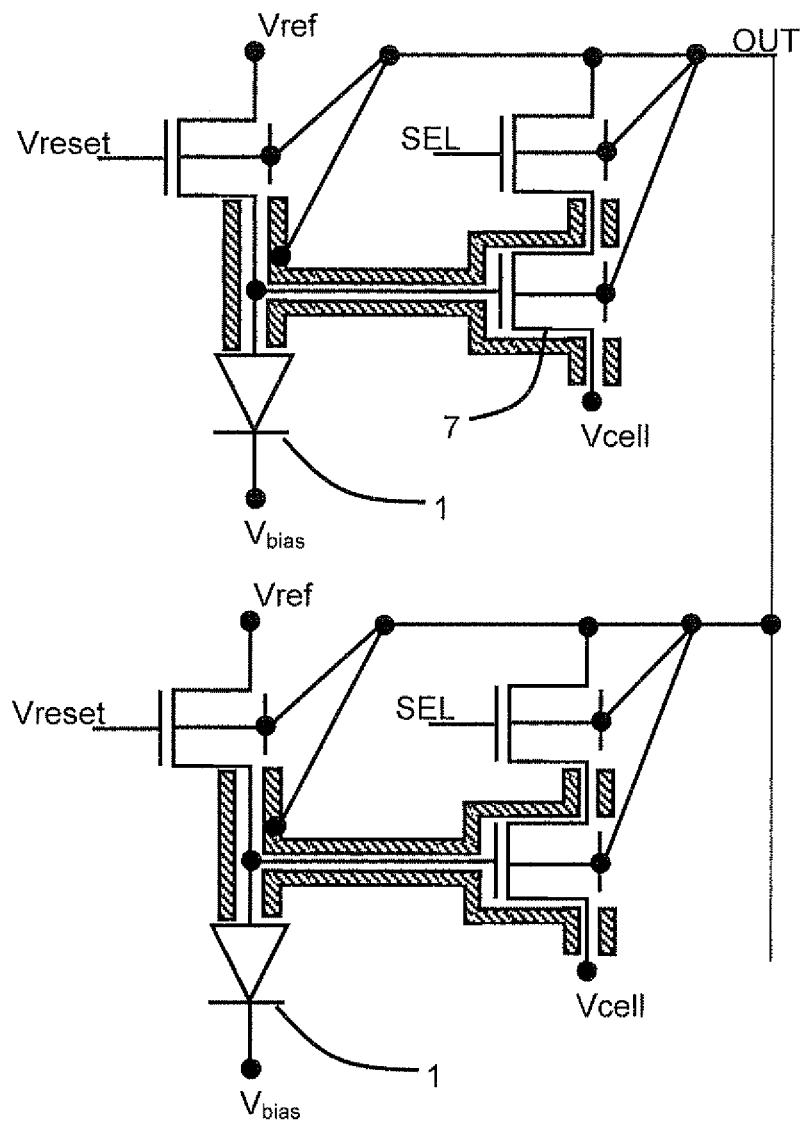
FIG. 6 is a schematic representation of a detection matrix provided with several detection circuits of the SFD type with a shielding.

In a particular embodiment which is illustrated in FIGS. 3 and 6 and can be combined with the preceding embodiments, the output of the readout circuit 4 is connected to the substrate of the first transistor 6 in the biasing circuit 3 so as to artificially apply the shielding under the channel of the first transistor 6, which is then a field effect transistor.

In another particular embodiment which can be combined with the preceding embodiments, the output of the readout circuit 4 is connected to the substrate of the follower transistor 7 in the readout circuit 4, which is then a field effect transistor. As previously, that makes it possible to cause the shielding 5 to continue under the channel of the transistor.

In a preferential alternative embodiment, the output of the readout circuit 4 is connected to the substrate of one or more other transistors of the readout circuit 4.

In a particular embodiment which can be combined with the preceding embodiments, the second source/drain electrode of the follower transistor 7 is linked to a first potential Vcell. This first potential is variable and follows the variations at the integration node N in order to reduce the influence of the parasitic capacitances.

Figure 5:
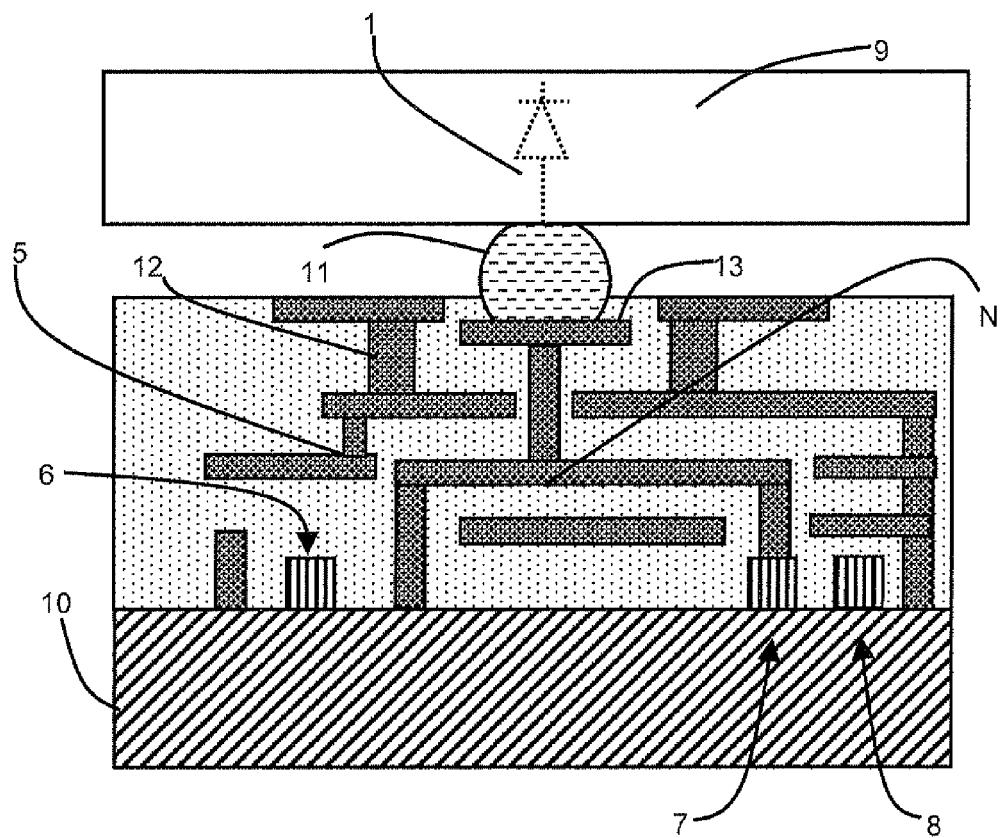
FIG. 5 is a schematic sectional representation of another detection circuit of the SFD type provided with a shielding between two substrates.

In a particular embodiment which can be combined with the preceding embodiments and which is illustrated in FIG. 5, the photodetector 1 is made on a first substrate 9. The photodetector 1 is the result of a classic stacking of semiconductor layers for forming for example a junction of the PN type and electrically conducting layers for imposing the potential Vbias. The photodetector is represented by a dotted line in the first substrate 9. The biasing circuit 3 and the readout circuit 4 are made on a second substrate 10. The circuits are materialized as an example by the transistors 6, 7 and 8. The photodetector 1, the biasing circuit 3 and the readout circuit 4 are connected together by means of a metal bump 11 which carries out the electric connection between the two substrates. The shielding 5 comprises a frame 12 around the bump 11, preferably on the surface of the second substrate and linked to the input of the readout circuit 4. This embodiment makes it possible to limit the influence of the parasitic capacitances in the hybridization zone. The frame 12 forms a ring around the bump 11. The frame 12 is connected to the output of the readout circuit 4 either directly or in the continuity of the shielding 5.

In a preferential way, the frame 12 comprises a upper part arranged at a predetermined distance around the electrical contact 13 with the bump 11. In this manner, there is an annular insulating zone between two electrically conducting zones. The frame 12 possibly comprises a lower part arranged on another plane which is arranged facing the insulating zone so as to at least partially cover the insulating zone. This particular architecture makes it possible to cut off the field lines passing through the insulating zone and to reduce the effect of the parasitic capacitances.

The frame 12 can be then linked to the shielding 5 by a wide-sized contact opening through the insulating zone or by a multitude of elementary contacts through the insulating layer if the manufacture technology does not allow to open wide-sized contacts. In a preferential way, the objective is to increase the screenings of the integration node N and of the electric power lines connecting the node N to the bump 11, to the transistor 6 and to the follower transistor 7. The shielding can be materialized by a more or less continuous ring formed around the node N and the lines. As an example, the shielding 5 is connected to a source/drain electrode of the transistor 8.

The shielding 5 and the frame 12 are preferentially formed in the electric interconnection layers of the circuit in order to be integrated as close to the parasitic capacitances as possible. In a preferential way, the shielding and the frame are formed in the electric interconnection levels of the second substrate 10 at the same time as the electric power lines connecting the transistors together and to the bump 11. The shielding 5 is arranged in a electrically insulating material, between the bump 11 and the semiconductor substrate comprising the readout circuit 4.

The shielding 5 and the frame 12 are formed by one or more electrically conducting materials, for example with doped semiconductor or with metal. In a preferential way, the shielding and the frame are made out of the same material as the conducting lines connecting the integration node to the various elements of the circuit. In an even more preferential way, the shielding and the frame are made out of a metallic material in order to have an important effect on the parasitic capacitances.

The detection circuit of the SFD type is illustrated as an example with three field effect transistors, but it is also possible to obtain a similar operation with a different number of transistors.

In the various illustrated embodiments, the photodetector 1 is a photodiode having a first terminal connected to a substrate potential Vbias. The second terminal of the photodetector is connected to the biasing circuit 3 which is represented here by a field effect transistor 6.

The circuit represented corresponds for example to a circuit of a detection matrix comprising a plurality of circuits.

The transistor 6 of the biasing circuit 3 is connected between the first biasing terminal applying a reference voltage Vref and the second terminal of the photodetector 1.

The second terminal of the photodetector 1 is connected to the input of the readout circuit 4 which is materialized by the gate electrode of the follower transistor 7. The follower transistor 7 and a selecting transistor 8 are connected in series by a first common electrode. The second electrode of the follower transistor 7 is connected to a first potential Vcell. The second electrode of the selecting transistor 8 is connected to an output line OUT which can be common to several circuits. The gate electrode of the selecting transistor 8 is connected to a selecting terminal receiving a selecting signal SEL making it possible to switch the transistor 8 into an on-state or an off-state.

The integration node N of the circuit is schematized by the common connection between the photodetector 1, the transistor 6 of the biasing circuit 3 and the follower transistor 7. However, the charges from the photodetector 1 are stored partly into the internal capacitor of the photodetector 1 and partly into the parasitic capacitors located for example in the transistors used and the metal lines.

The shielding 5 physically surrounds the integration node N with one or more electric power lines. In an illustrated preferential way, the shielding 5 is also arranged around one of the capacitive components forming the integration node N, for example around the line connecting the biasing transistor 6 to the photodetector 1 and/or around the line connecting the gate electrode of the follower transistor to the photodetector.

In the example illustrated, the shielding 5 is arranged around the various parasitic components from the biasing circuit 3 and the readout circuit 4.

Moreover, the substrates of the biasing transistor 4, the follower transistor 7 and the selecting transistor 8 are connected to the output line OUT so as to have a very strong drop in the parasitic capacitances.

In a preferential embodiment, the biasing circuit 3 and/or the readout circuit 4 are covered by an electrically insulating material inside which one or more metal lines are formed for connecting the various elements together. The metal lines are made in the metal interconnection layers of the circuit. In a preferential way, the metal shielding 5 is made in the interconnection layers of the circuit in order to be placed as close as possible to the metal lines used for transmitting the signal. That makes it possible to have an important effect on the parasitic capacitances.

As illustrated in FIG. 6, the detection circuit can be integrated as a detection matrix with a plurality of detection circuits organized in one or two dimensions.

When several circuits are associated in order to form a group of detectors, for example a detection line, the circuits are advantageously connected together by an output line OUT connected to the output terminals of the various readout circuits 4.

In this manner, the signals emitted by the various readout circuits 4 flows through the same output line OUT at different moments. The detection circuits includes a selecting input in order to avoid the simultaneous flow through two circuits of the same detection line.

In a preferential embodiment, the output line OUT is connected to the metal shielding 5 of its associated circuits. The potential of the output line OUT varies with time as the signals from the various circuits flows therethrough. However, the potential of the output line OUT is connected to the potential of the integration node N being read. Thus, during the reading phase, the potential of the output line OUT varies in the same direction as the potential of the integration node N, which makes it possible to limit the influence of the parasitic capacitors. According to the architecture of the readout circuit used, the potential difference between the output line OUT and the integration node N are constant during the reading phase. The potential of the output line OUT varies with time and moves according to the various integration nodes N, as they are read.

When working, the photodetector 1 is reverse biased by switching the biasing transistor 6 into the on-state. The Photodetector 1 is biased between the reference potential Vref and the biasing potential Vbias.

Then, the biasing transistor 6 is switched into an off-state and the photodetector 1 comes back into a floating state. When it is in a floating state, the photodetector 1 converts the light radiation received into a certain amount of electrons representative of the scene observed. The variation of the potential at the integration node N represents the signal provided by the photodetector 1 on the scene observed. The potential at the integration node N is applied to the control electrode of the follower transistor 7. In the case of a matrix integration, it is preferable that all the photodetectors 1 carry out the acquisition of the scene observed for the same duration of integration.

At the time of the reading phase, the potential at the output of the follower transistor 7 (at the first electrode) and the potential at the output of the selecting transistor 8 (at its second electrode) vary in the same direction as the potential at the integration node N. Thus, the output line OUT receives a signal representative of the scene observed by means of the integration node N. Moreover, the metal shielding 5 placed around the integration node N varies as the potential value at the node N varies, which limits the transfers of electric charges from one reading phase to the following reading phase. In a preferential way, the value representative of the scene observed is the variation of the potential at the integration node N relative to its initial value. In an even more preferential way, the value representative of the scene observed is the variation of the potential at the integration node N between two successive readings, for example with a Correlated Double Sampling technique.

The metal shielding 5 forms a screening device in the detection circuit what makes it possible to reduce, even to virtually eliminate, the parasitic capacitances. The device has then an increased sensitivity performance and a decreased level of noise in term of noise electrons.

The invention claimed is:

1. A detection circuit comprising:
a photodiode connected to an integration node,
a biasing circuit for biasing the photodiode between a first reverse-bias state and a second floating state so as to form a Source Follower per Detector,
a readout circuit connected to the integration node for generating a signal representative of the scene observed by the photodiode,
a metal shielding arranged around the integration node and connected to an output of the readout circuit configured to have a potential varying in a same way as a potential at the integration node and form an electric shielding, wherein
the photodiode is made on a first substrate, the biasing circuit and the readout circuit are made on a second substrate, the photodiode being connected to the biasing circuit and the readout circuit by means of an electric contact, the electric contact being surrounded by a metal ring connected to an output of the readout circuit.

2. Detection circuit according to claim 1, wherein the readout circuit comprises a follower transistor having an electrode connected to an electric node configured to have a potential varying in the same direction as the potential at the integration node.

3. Detection circuit according to claim 1, wherein the metal shielding is connected to an output of the readout circuit configured to have a constant potential difference relative to the potential at the integration node.

4. Detection circuit according to claim 1, wherein the metal shielding surrounds the electric power line connecting the photodiode to the biasing circuit.

5. Detection circuit according to claim 1, wherein the metal shielding surrounds the electric power line connecting the integration node to the readout circuit.

6. Detection circuit according to claim 1, wherein the metal shielding is arranged in an electrically insulating material, between the electric contact and the semiconductor substrate comprising the readout circuit.

7. Detection circuit according to claim 1, wherein the retention node is a capacitive retention node configured to store electric charges emitted by the photodiode and causing shifting of the potential of the retention node from reverse-bias to forward-bias.

8. Detection matrix including a plurality of circuits according claim 1, wherein each readout circuit comprising a specific selecting input, an output line being connected to the output terminal of the readout circuits.

9. Detection circuit according to claim 2, wherein the follower transistor has a control electrode connected to the integration node and another electrode connected to the metal shielding.

10. Detection matrix according to claim 7, wherein the output line is connected to the metal shielding.

11. A detection circuit comprising:
a photodiode connected to a capacitive integration node,
a biasing circuit for biasing the photodiode between a first reset state wherein the photodiode is reverse-biased and a second acquisition state wherein the photodiode is in a floating state so as to form a Source Follower per Detector,
a readout circuit connected to the integration node for generating a signal representative of the scene observed by the photodiode, the readout circuit being coupled to the integration node during the acquisition state,
a shielding made of conducting material arranged around the integration node and connected to an output of the readout circuit configured to have a potential varying in a same way as a potential at the integration node, wherein
the photodiode is made on a first substrate, the biasing circuit and the readout circuit are made on a second substrate, the photodiode being connected to the biasing circuit and the readout circuit by means of an electric contact, the electric contact being surrounded by a metal ring connected to an output of the readout circuit.

* * * * *